United States Patent [19]

Schelhorn

[11] Patent Number: 5,001,829
[45] Date of Patent: Mar. 26, 1991

[54] METHOD FOR CONNECTING A LEADLESS CHIP CARRIER TO A SUBSTRATE

[75] Inventor: Robert L. Schelhorn, Vincentown, N.J.

[73] Assignee: General Electric Company, Morrestown, N.J.

[21] Appl. No.: 459,898

[22] Filed: Jan. 2, 1990

[51] Int. Cl.⁵ .............................................. H05K 3/34
[52] U.S. Cl. ...................................... 29/840; 118/697; 174/52.2; 228/180.2; 357/80; 361/412; 427/96
[58] Field of Search ........................ 427/96; 118/697; 29/830, 832, 833, 834, 840, 740; 228/180.2; 174/52.2; 361/400, 413, 412; 357/80

[56] References Cited

U.S. PATENT DOCUMENTS

| | | | |
|---|---|---|---|
| 4,184,043 | 1/1980 | Hildering | 29/840 X |
| 4,642,889 | 2/1987 | Grabbe | 29/840 |
| 4,763,407 | 8/1988 | Abe | 29/840 |
| 4,788,767 | 12/1988 | Desai et al. | 29/840 X |

OTHER PUBLICATIONS

IBM Tech. Discl. Bull., vol. 23, No. 5, Oct. 1980, pp. 2156-2157 by Galloway et al.
IBM Tech. Discl. Bull., vol 24, No. 9, Feb. 1982, pp. 4647-4649 by Audi.

Primary Examiner—Carl E. Hall
Assistant Examiner—Carl J. Arbes
Attorney, Agent, or Firm—William H. Meise

[57] ABSTRACT

A Leadless Chip Carrier (LCC) is mounted on a circuit board on elongated solder posts to provide clearance between the LCC and the board. The process for producing solder posts involves the deposition of a temporary stencil surrounding the conductive pads on the board. The removable stencil around the pads provides support for molten solder during reflow and prevents the chip carrier from compressing the molten solder thereby insuring desirable spacing between the chip carrier and the board.

4 Claims, 1 Drawing Sheet

METHOD FOR CONNECTING A LEADLESS CHIP CARRIER TO A SUBSTRATE

This invention relates to a process and apparatus for surface mounted leadless chip carriers in which the carriers are supported on solder posts to space the chip carrier from a circuit board; and more particularly, it relates to a process for forming the elongated solder posts supporting the chip carrier.

BACKGROUND OF THE INVENTION

Leadless Chip Carriers (LCCs) are well known in fabricating techniques involving surface mounted devices. It is desirable in such assemblies that the chip carrier be separated from the circuit board in order to allow removal of any solder flux or spattered solder which has found its way underneath the carrier during the fabricating process. It is also desirable to have elongated solder joints between the conductive pads on the carrier and on the board to avoid solder joint failures caused by different thermal coefficients of expansion between the chip carrier and the circuit board. By increasing the solder joint height, thereby separating the chip carrier and the substrate, fatigue failures due to these different coefficients of temperature expansion can be reduced because an elongated solder connection is more compliant and can bend somewhat when stressed and will not fracture as readily as a shorter solder joint.

Typically, in mounting leadless chip carriers, solder paste is first deposited on the circuit board connector pads. The thickness of the solder paste is generally equal to the desired spacing between the chip carrier and the board. The connector pads on the board and the solder paste are individually aligned with the conductive pads on the chip carrier. The solder is heated causing the solder paste to reflow and form solder joints between the connector pads on the chip carrier and the corresponding connector pads on the circuit board. It has been found, however, that problems exist in forming solder posts which are sufficiently high to provide the clearance desired for cleaning under the LCCs and which are sufficiently compliant to avoid fatigue and fracture under various temperature conditions. These problems are basically related to the fact that the mass of the leadless chip carrier is large relative to the mass of the solder paste so that it has a tendency to compress or squash the molten solder. The problem is exacerbated by the present movement toward utilization of high pad count packages in small package configurations. Today, chip carriers with pad counts of 132 to 256 pads are commonly used. This requirement for small, high pad count packages imposes further limitations on the spacing and the size of the pads with center-to-center spacings of 20 mills or less being quite common. Obviously, with such narrow spacings, the cross section of the pad and, hence, the cross section of the solder paste is concurrently reduced. This increase the compression or squashing of the solder during reflow and reduces the spacing between the carrier and the board as well as producing spatter and possible shorting by the spattered solder between adjacent pads.

Applicant has found that elongated solder post attachment of leadless chip carriers may be readily achieved, and the problem of solder compression or squashing during solder reflow due to the mass of the chip carrier may be virtually eliminated by providing a temporary support for the solder paste prior to and during reflow of the solder. This temporary support surrounds the solder paste during reflow and supports the chip carrier thus allowing soldering to the chip carrier pads without compression of the solder. After cooling and hardening of the solder, the support element is removed by chemical processes presently to be described.

OBJECTIVES

It is, therefore, a principal objective of the invention to provide a method for soldering leadless chip carriers to a circuit board or substrate by means of compliant, elongated solder posts.

Another objective of the invention is to provide a process for soldering a chip carrier to a circuit board in which the solder paste mounted on the circuit board conductive pads is surrounded by a temporary support before and during reflow of the solder paste.

Other objectives and advantages of the invention will become apparent as the description thereof proceeds.

SUMMARY OF THE INVENTION

The various objective and advantages of the invention are realized in an arrangement in which a removable stencil or mask having a thickness equal to the desired separation between the chip carrier and the board is deposited on the board with the stencil covering the board except over the board conductive pads. Solder paste is screened into the openings in the stencil and onto the conductive pads. After the chip carrier is placed on the stencil, the assembly is heated, causing the solder paste to reflow creating a solder joint between the conductive pads on the board and the chip carrier connector pads located on the underside of the chip carrier. Because the stencil supports the chip carrier, it limits compression of the solder posts during reflow resulting in an elongated, compliant solder joint. Subsequent to cooling of the reflowed solder, the stencil is dissolved chemically.

DETAILED DESCRIPTION OF THE INVENTION

Figure 1:
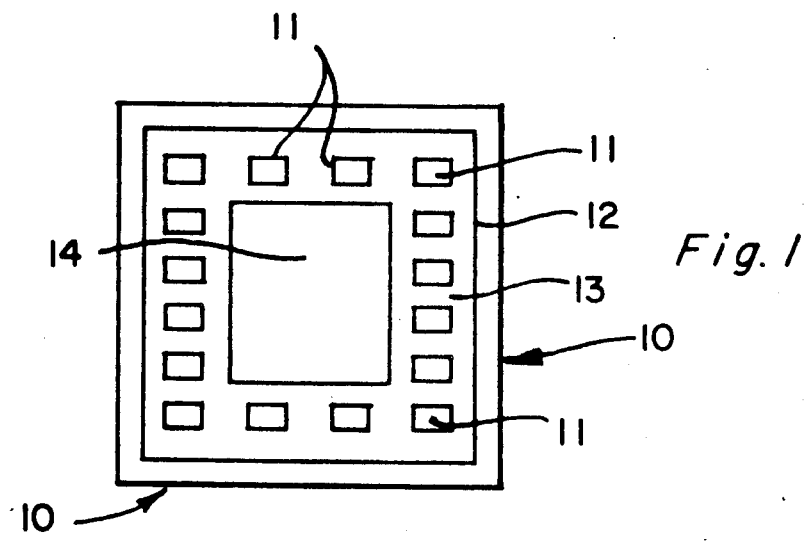
FIG. 1 is a plan view of the circuit board substrate showing the conductive pads on the substrate as well as the outline of the supporting stencil.

FIG. 1 shows a circuit board or substrate 10 which has an array of rectangular, electrically conductive contact pads 11 mounted around its periphery, which pads are aligned with the contact pads of a leadless chip carrier to be mounted on the board. Deposited on the surface of board 10 and shown by the rectangular outline 12 is the support stencil 13 which is preferably a layer of photo-resist material having a configuration such that the board is covered in areas other than those over the conductive pads 11. Circuit board 10 has a central portion 14, located substantially under the leadless chip carrier body, which is not covered by the stencil.

After the stencil, as shown in FIG. 1, is deposited on the surface of the circuit board, solder paste is deposited in the open areas over pads 11 by means of a stainless steel printing mask. The printing mask has openings aligned with the stencil openings over the pads. After solder paste is pressed into these openings, the stainless steel mask is removed, and the leadless chip carrier is positioned on the stencil with its conductive pads aligned with the solder paste.

The preferred method for producing stencil 12 which masks the board except in the central area 14 and over connector pads 11 is a photographic method. Thus the entire surface of the pad is covered by a photo-resist material, which, as is well known, hardens when exposed to light. Photo-resist materials are available from many sources, such as the Dynachem Company of 13860 Park Center Road, Herndon, Va., under its trade designation Photoresist AX-6. The photo-resist is exposed through a negative of the board connector pad pattern shown in FIG. 1. That is, the negative has dark or non-light transmitting portion aligned with pads 11 and center portion 14 and transparent or light transmitting portions in all other areas. The negative is illuminated by a light source, and light is transmitted to all areas but those over pads 11 and center portion 14 thereby exposing the resist and causing it to harden. The portion where the light is blocked, namely, pads 11 and center portion 14, are not hardened and remain soft. The negative is then removed. The exposed photoresist is immersed in a laminar developer such as is available from the aforementioned DYNACHEM Company under its trade designation KB-1A or KB-1B. KB-1A is 20–30 percent by weight solution of potassium carbonate while KB-1B is a 90 percent or greater by weight solution of ethylene glycol monobutyl ether. The entire assembly is then dipped in a solution of caustic which dissolves the unexposed portions thus leaving a hardened stencil everywhere except center portion 14 and pads 11. Pads 11 are thus surrounded on all four sides by the wall of the stencil.

Center portion 14 is removed since it is very difficult to remove any hardened photo-resist in the center once the leadless chip carrier has been mounted to and soldered to the pads and covers this center portion.

Figure 2:
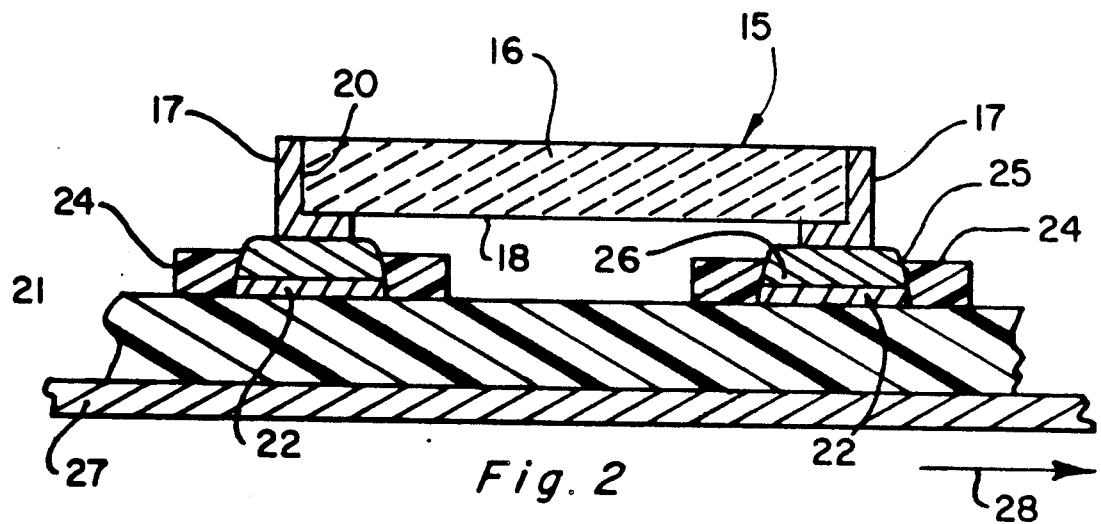
FIG. 2 is a sectional elevation of one embodiment of the present invention showing an LCC prior to soldering.

Leadless chip carrier 15 shown in FIG. 2 is of conventional design and has a ceramic body 16. The integrated circuit chips, not shown, mounted in the chip carrier are connected to an array of conductive pads contact pads 17 spaced around the periphery of chip carrier body 16. Contact pads 17 are generally L shaped with one leg extending along the bottom surface 18 and the other leg extending along side walls 20. Such L shaped pads are conventional in small chip carriers; it will be understood, however, that in larger chip carriers, the leg extending along sidewall 20 may be eliminated. Typically, the number of contact pads on a chip carrier is quite large, with 132–256 pads being quite common; although only two are shown in FIG. 2 for the sake of simplicity of illustration. Circuit board 21 comprises an insulating substrate on which a plurality of electrically conductive pads 22 are mounted. Pads 22 are aligned with the LCC contact pads 17. Each contact pad 22 is surrounded by a photo-resist support stencil 24 formed in the manner described in connection with FIG. 1; i.e., by exposure of photo-resist through a suitable negative so it hardens the resist in the areas around and between the pads but not in the areas over the pads in the center of the board. Stencil 24, as may be seen by observation, forms a chamber 25 above each of the conductive pads 22 into which solder paste 26 is deposited by a screening process. Solder paste post 26 as can be seen in FIG. 2, extends above stencil 24 and comes into contact with contact pad 17 on the underside of the carrier chip. Solder paste 25 may typically be 60–40 tin-lead composition which has a melting temperature of 183 degrees C.

The assembly, as described above, is placed on a support 27 which may be a conveyor belt which moves in the direction shown by the arrow 28. The conveyor belt 27 moves circuit board 21 into a vapor phase heating chamber where the solder paste is melted to form a solder joint between chip carrier contact pads 17 and board contact pads 22. That is, the vapor phase chamber contains a saturated fluorocarbon liquid such as that available from the 3M Center, St. Paul, Minn. 55144 under their trade designation FC-70. The temperature of the FC-70 fluorocarbon vapor in the saturated phase is 216 degrees C.

The assembly shown in FIG. 21 is maintained in the vapor chamber for a period of two to five (2–5) minutes during which period the 216 degrees C. fluorocarbon vapor condenses on the solder paste and transfers heat to the solder paste. The heat transfer to the solder paste is sufficient to melt the solder paste and, during this reflow period, produces a solder joint between the now molten solder and chip carrier contact pad 17. Surface tension moves the molten solder up along the portion of contact pad 17 positioned along the lateral wall of the chip carrier.

Figure 3:
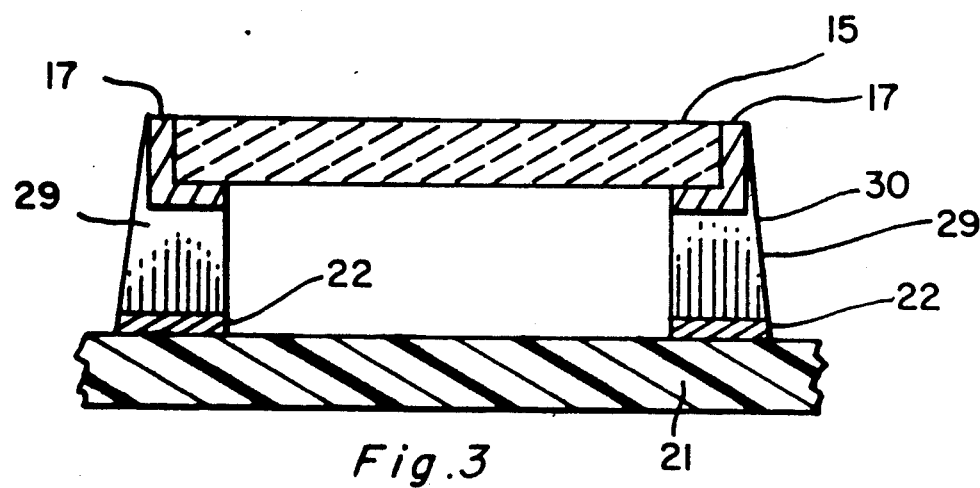
FIG. 3 is a sectional elevation of a chip carrier assembly showing the elongated solder posts produced by the process of the instant invention.

The assembly is moved out of the chamber, and the solder cools to produce a solder connection between circuit board pads 22 and chip carrier contact pads 17. The assembly is then moved into a vapor degreaser which contains a 1,1,1- Trichloroethane vapor which removes any remaining solder flux. The photoresist forming the supporting stencil is then removed using suitable stripper such as that available from the aforesaid DYNACHEM Company under its trade designation ALKASTRIP 99A although there are many similar products available which can be used with equal facility. Dissolving the photo-resist stencil leaves the chip carrier supported on a plurality of elongated solder post 29 positioned between the circuit board conductive pads 22 and the chip carrier contact pads 17. The elongated solder posts, as shown in FIG. 3, contain a side element 30 which is soldered to the chip carrier productive pad extending along the lateral side of chip carrier 15. Thus the elongated solder joint is connected both to the chip carrier conductive pad extending along the underside of the chip carrier as well as the portion of the pad connected to the side portion of the chip. However, as pointed out previously, in large chip carriers where the conductive pad portion extending along the lateral side of the chip carriers is not present, no such solder joint extension is necessary or required.

The basic process for forming elongated solder joints between a leadless chip carrier and a plurality of conductive pads on a circuit board or substrate may be described briefly by means of the following sequence of process steps:

1. The printed circuit board is covered by a layer of Dynachem AX-6, or equivalent, photo-resist to a thickness of 6 to 30 mils.
2. The photo-resist is exposed through a negative of the conductive pad pattern on the circuit board to harden the photo-resist in all areas except the central area and the area over the conductive pads on the circuit board.

3. The photo-resist is developed by dipping the board and the exposed photo-resist in a caustic solution which dissolves the unexposed portions of the photo-resist over the conductive pads in the center portion of the circuit board thereby forming a removable stencil around each of the conductive pads.

4. 60–40 tin-lead solder paste is screened into the openings over each of the conducting pads through a stainless steel screen having openings aligned with the conductive pads on the board. The solder paste extends above the surface of the stencil as shown in FIG. 2.

5. The solder paste is dried at 50 degrees C. for two (2) to five (5) minutes to remove all volatiles.

6. The chip carrier is placed on the stencil with the conductive pads on the chip carrier aligned with the solder paste posts.

7. The chip carrier-circuit board assembly is placed on a belt and moved into vapor phase chamber containing saturated FC-70 fluorocarbon vapor at 216 degrees C. The assembly remains in the vapor chamber for 2–3 minutes to melt the solder and produce solder connections between the circuit board conducting pads and the corresponding chip carrier conductive pads.

8. The assembly is moved out of vapor chamber and into a degreasing chamber containing 1,1,1 Trichloroethane vapor to remove all solder flux and is then exposed to a stripper to dissolve the photo-resist stencil surrounding the solder post.

9. The assembly is removed from degreaser chamber and dried.

It will now be apparent that a surface mounted chip carrier assembly has been described which is supported on a circuit board on a plurality of elongated compliant solder posts which provide suitable clearance between the chip carrier and the board to permit thorough cleaning under the chip carrier after assembly of the device. Furthermore, a process for soldering the chip carrier to a circuit board by means of elongated, compliant solder post has been described in which compression or squashing of the solder during reflow is inhibited by means of a removable, supporting stencil for the solder paste and the solder post.

What is claimed as new and is desired to be secured by U.S. Letters Patent is:

1. A method for connecting a leadless chip carrier having an array of peripheral metallic pads to a substrate having a corresponding array of metallic pads, including the steps of:

covering said substrate with an optically sensitive material;

treating said optically sensitive material with radiant energy to harden said optically sensitive material in selected areas other than those over said substrate pads;

removing unhardened material to form a stencil, which defines chambers over said substrate pads;

depositing solder paste in said chambers;

positioning a chip carrier on said stencil with the peripheral pads aligned with the substrate pads and the solder paste in the chambers over the substrate pads;

applying thermal energy to said chip carrier and substrate to melt the solder paste and form a solder joint between substrate pads and peripheral pads; and dissolving said stencil after said solder joint is formed.

2. A method according to claim 1, wherein said selected areas include an annular region surrounding a region centered within said array of peripheral metallic pads.

3. A method for connecting a leadless chip carrier having an array of peripheral metallic pads to a substrate having a corresponding array of metallic pads, including the steps of:

covering said substrate with a photoresist stencil material;

exposing said photoresist to light through a negative of the substrate including said pad array, thereby hardening said photoresist stencil material in all areas exposed to light;

removing unhardened portions of said photoresist stencil material from said substrate to form a stencil having a plurality of chambers over each of said substrate pads for receiving solder paste;

depositing solder paste in said chambers;

positioning a chip carrier on said stencil with the peripheral pads aligned with the substrate pads and the solder paste in the chambers over the substrate pads;

applying thermal energy to said chip carrier and substrate to melt the solder paste and form a solder joint between substrate pads and peripheral pads; and dissolving said stencil after said solder joint is formed.

4. A method for connecting a leadless chip carrier having an array of peripheral metallic pads to a substrate having a corresponding array of metallic pads, comprising the steps of:

depositing a removable stencil around each of the pads on said substrate to form chambers over each of the substrate pads;

depositing solder paste in said chamber through a mesh having an array of openings aligned with said array of peripheral metallic pads;

positioning a chip carrier on said stencil with the peripheral pads aligned with the substrate pads and the solder paste in the chambers over the substrate pads;

applying thermal energy to said chip carrier and substrate to melt the solder paste and form a solder joint between substrate pads and peripheral pads; and dissolving said stencil after said solder joint is formed.

* * * * *